US006522588B2

(12) United States Patent
Benedix

(10) Patent No.: US 6,522,588 B2
(45) Date of Patent: Feb. 18, 2003

(54) METHOD AND DEVICE FOR STORING AND OUTPUTTING DATA WITH A VIRTUAL CHANNEL

(75) Inventor: Alexander Benedix, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/932,893

(22) Filed: Aug. 20, 2001

(65) Prior Publication Data

US 2002/0105836 A1 Aug. 8, 2002

(30) Foreign Application Priority Data

Aug. 18, 2000 (DE) .......................... 100 40 462

(51) Int. Cl.[7] .............................. G11C 7/00
(52) U.S. Cl. ................... 365/189.05; 365/220
(58) Field of Search ...................... 365/189.05, 220

(56) References Cited

U.S. PATENT DOCUMENTS 6,064,404 A * 5/2000 Aras et al. ................ 345/507
6,128,244 A * 10/2000 Thompson et al. ...... 365/230.03
6,351,423 B2 * 2/2002 Ooishi ........................ 365/207

FOREIGN PATENT DOCUMENTS

DE         199 32 683 A1      2/2000

OTHER PUBLICATIONS

Ho–Jun Song et al.: A 200 MHz Register–Based Wave––Pipelined 64M Synchronous DRAM, IEEE Journal of Solid–State Ciruits, vol. 32, No. 1, Jan. 1997, pp. 92–99.
Anonymous: "Virtual Channel SDRAM", *NEC User's Manual, Jul. 1998, No. M13311EJ1V0UM00*, pp. 1–10.

* cited by examiner

*Primary Examiner*—M. Tran
(74) *Attorney, Agent, or Firm*—Laurence A. Greenberg; Werner H. Stemer; Ralph E. Locher

(57) ABSTRACT

A description is given of a method and a device for outputting data via a buffer memory. In which the data, which are intended to be output first from the buffer memory are selected. The selected data are written either to a predetermined area of the buffer memory and/or to the buffer memory temporally before the rest of the data and output.

7 Claims, 5 Drawing Sheets

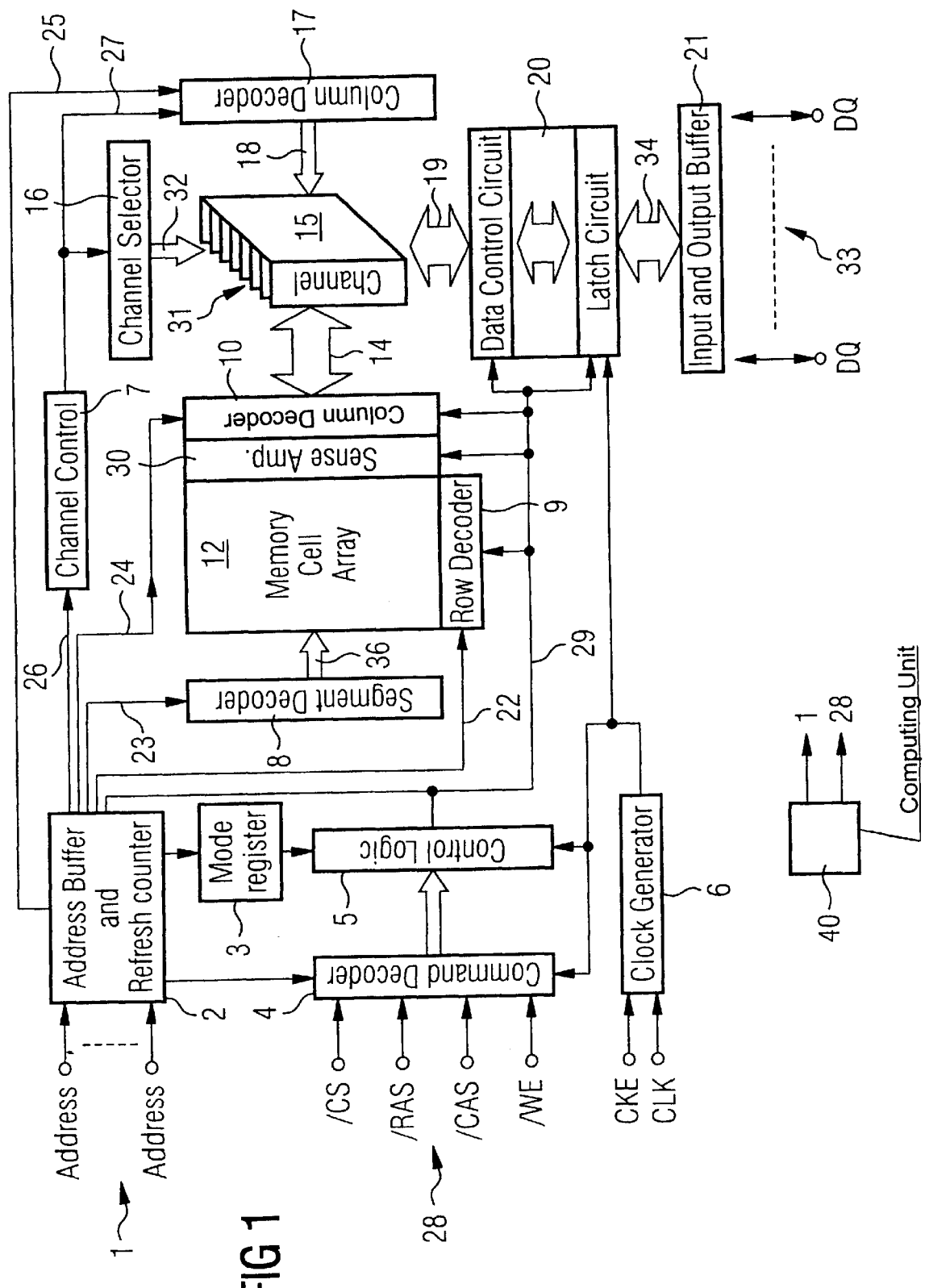

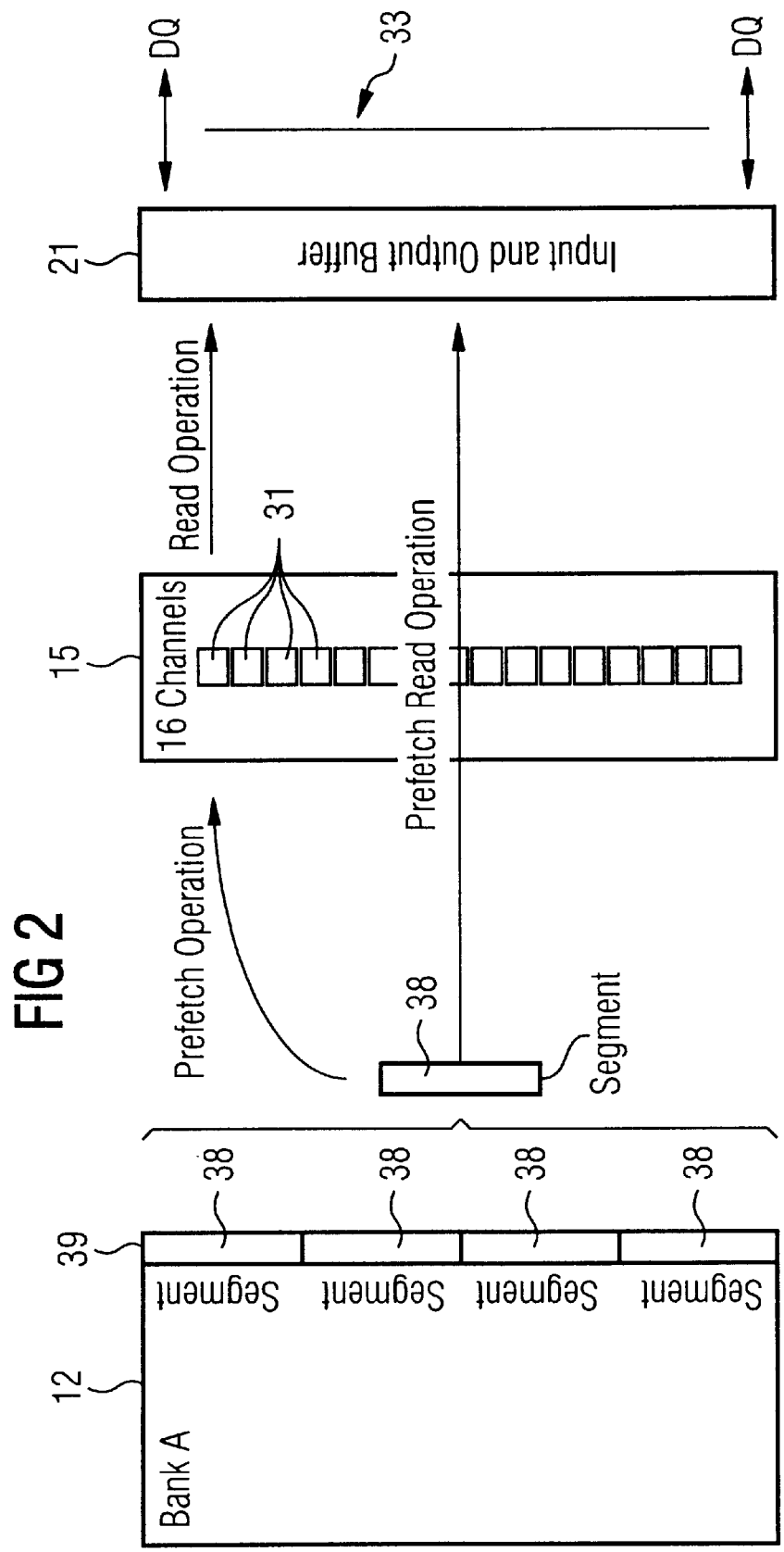

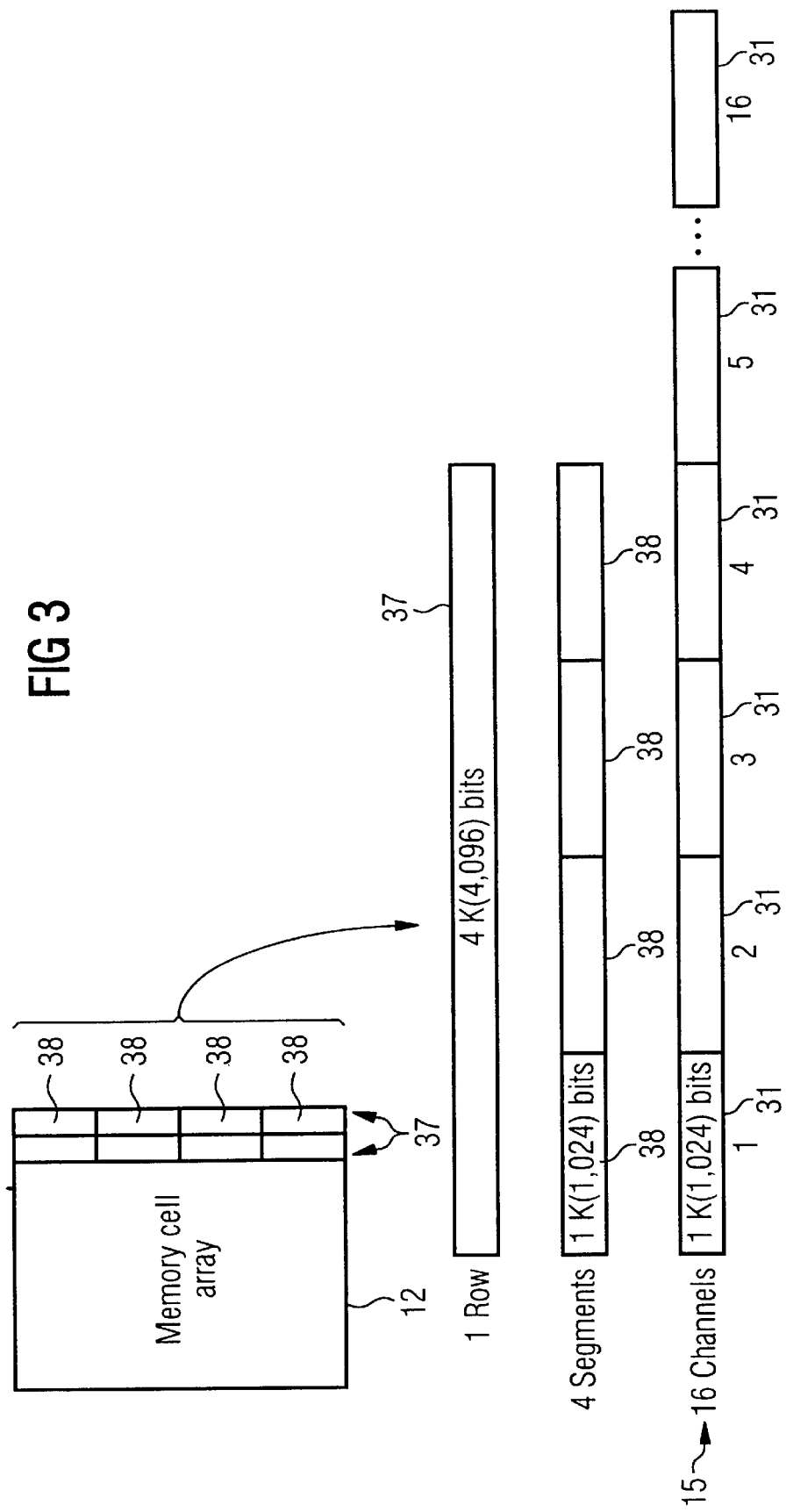

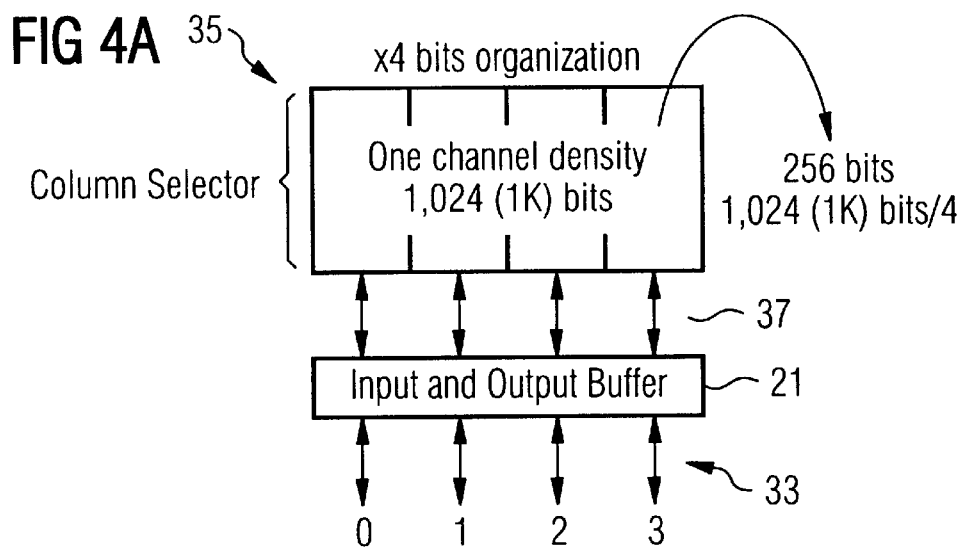
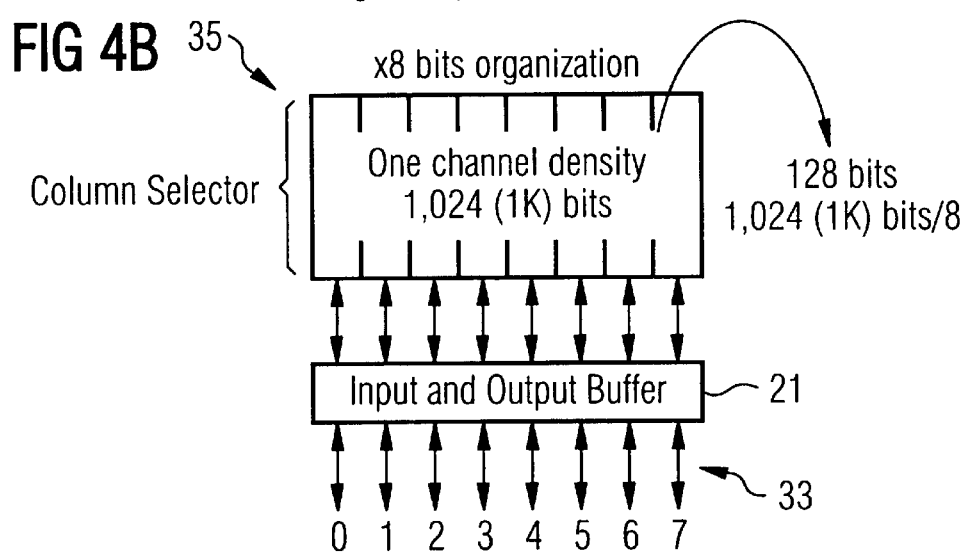
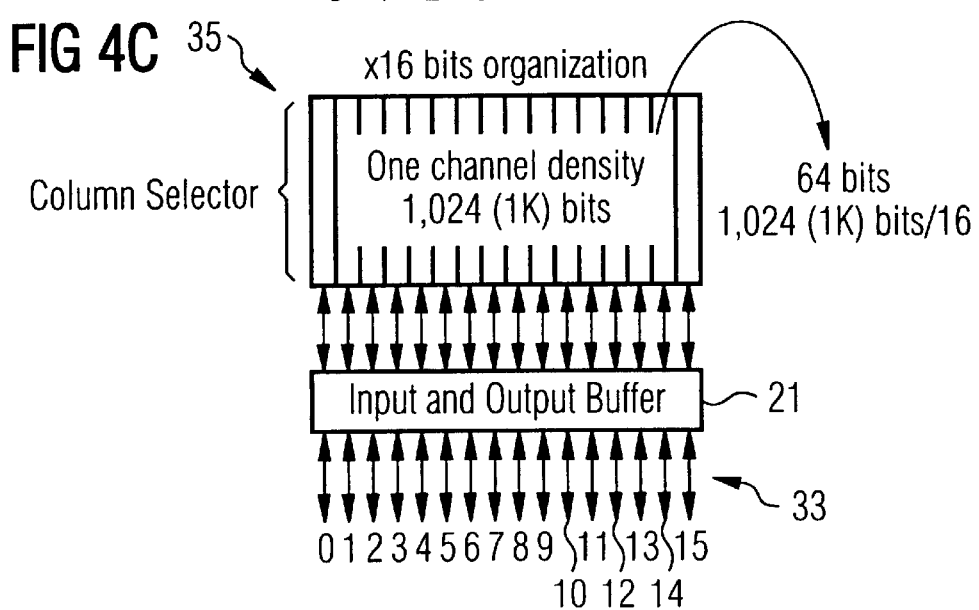

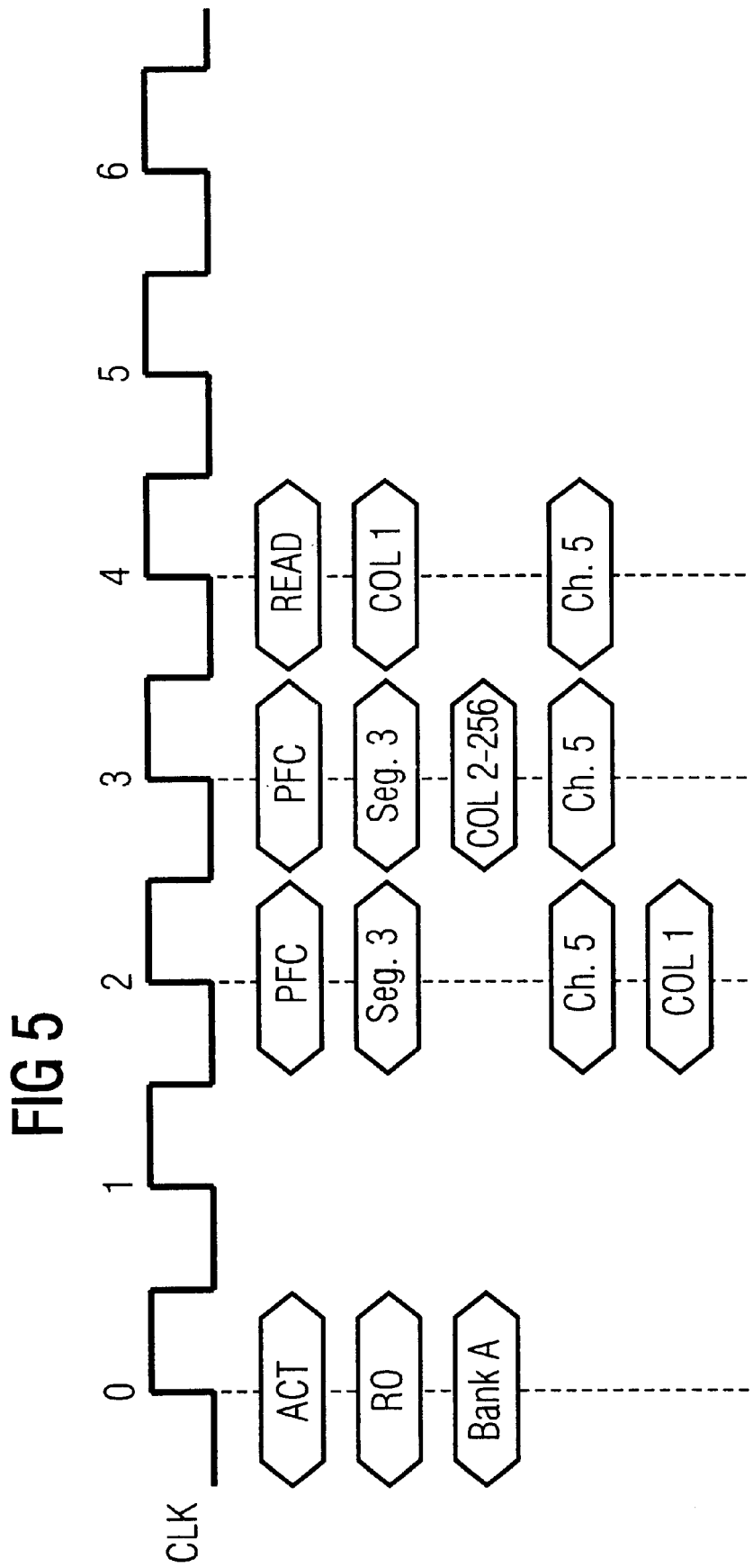

METHOD AND DEVICE FOR STORING AND OUTPUTTING DATA WITH A VIRTUAL CHANNEL

BACKGROUND OF THE INVENTION

Field of the Invention

The invention relates to a method for storing and outputting data, in which date are stored in a memory and in which a predetermined quantity of the data from the memory are loaded into a buffer memory. The data are subsequently output from the buffer memory through an output unit. A control unit is provided for controlling the data transfers and the associated components.

The publication titled"How to use Virtual Channel SDRAM", User's Manual (M13311EJ1V0UM00), July 1998, from NEC, discloses SDRAM memories in which data of a segment from a memory bank are loaded into a memory channel. The segment is selected from a defined row of the memory bank. After buffer storage in the memory channel, the data are output via an interface via the specification of the column address. The use of the memory channel affords the possibility of buffer-storing data from a memory having a relatively long access time into a buffer memory having a short access time and subsequently outputting them. In this way, on statistical average the data can be read more rapidly from the memory. Since the data are read segment by segment into the memory channel, a relatively large interference signal is generated on account of the large number of data in the course of reading into the memory channel, with the result that the waiting time after which the data read during a read operation (in the sense amplifier, i.e. after a sensing operation) can be written to the memory channel is relatively long. This increases the total waiting time before the data can be output via the interface.

SUMMARY OF THE INVENTION

It is accordingly an object of the invention to provide a method and a device for storing and outputting data with a virtual channel which overcome the above-mentioned disadvantages of the prior art devices and methods of this general type, in which the data can be output more rapidly via an interface.

With the foregoing and other objects in view there is provided, in accordance with the invention, a method for storing and outputting data. The method includes storing the data in a memory, and loading a predetermined quantity of the data from the memory into a buffer memory. The loading step includes determining a predetermined number of selected data of the predetermined quantity that is intended to be output first, and loading the selected data into the buffer memory temporally before loading remaining data of the predetermined quantity. The selected data are output from the buffer memory through an output unit and then the remaining data are output from the buffer memory through the output unit.

It is advantageous for the data which are intended to be output first via the interface to be selected and written temporally first to the buffer memory and for the remaining data of the segment to be read into the buffer memory only at a later point in time. Since the data read in first constitute a very much smaller number than the data of the entire segment, the interference signal generated by the process of writing to the buffer memory is also significantly smaller, with the result that the data can be output from the buffer memory via the interface after a shorter waiting time.

In a further advantageous embodiment, the data, which are intended to be output first via the interface are selected and written to a predetermined area of the buffer memory. The remaining data of the segment are preferably also written simultaneously to another area of the buffer memory. Since the selected data constitute a smaller number, the interference signal generated by the selected data in the predetermined area of the buffer memory is also significantly smaller than the interference signal generated by the remaining data of the segment. As a result, the selected data can be output via the interface after a shorter waiting time than the remaining data of the segment.

Preferably, the number of data which can be output simultaneously via the interface are selected from the segment. Effective adaptation of the selected data to the output type of the interface is achieved in this way.

In accordance with an added mode of the invention, there is the step of configuring the memory as a semiconductor memory having memory cells for storing the data. The data stored in the memory cells are loaded into the buffer memory using an amplifying circuit.

In accordance with an additional mode of the invention, there is the step of outputting the data using a parallel interface with n lines and in that n data as the selected data are transferred temporally first into the buffer memory and subsequently output via the parallel interface.

In accordance with another mode of the invention, there is the step of writing the remaining data to the buffer memory temporally later than the predetermined number of the selected data.

With the foregoing and other objects in view there is provided, in accordance with the invention, a device for storing and reading out data. The device contains a memory, a buffer memory connected to the memory, an output unit connected to the buffer memory, and a control unit for defining a total quantity of the data intended to be read out and connected to the memory, the buffer memory and the output unit. The control unit determines a predetermined number of selected data that are intended to be read out first from the total quantity of the data. The control unit first initiates the loading of the selected data into the buffer memory and subsequently outputs the selected data using the output unit.

In accordance with an added feature of the invention, the control unit loads remaining data of the total quantity of the data into the buffer memory before the outputting of the selected data from the buffer memory and outputs the remaining data after the outputting of the selected data from the buffer memory.

In accordance with a further feature of the invention, the memory is a matrix-type semiconductor memory having memory cells. An amplifier circuit is connected to the memory cells and the buffer memory, and a column decoder and a row decoder are each connected to the memory cells and the control unit. The control unit addresses individually the memory cells by driving the column decoder and the row decoder and transfers the data of the memory cells through the amplifier circuit to the buffer memory.

In accordance with a concomitant feature of the invention, the memory buffer has memory rows. The output unit is an interface with n parallel data lines connected to the memory rows of the buffer memory, and the memory rows can be read out simultaneously from the buffer memory.

Other features which are considered as characteristic for the invention are set forth in the appended claims.

Although the invention is illustrated and described herein as embodied in a method and a device for storing and outputting data with a virtual channel, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a device for storing and outputting data according to the invention;

FIG. 2 is a block diagram showing the reading-out of data via memory channels;

FIG. 3 is a block diagram showing a division of the data in the memory and in the memory channel;

FIG. 4 is a block diagram showing the construction of memory channels with interfaces having a different bit width; and FIG. 5 is a timing diagram showing a method for outputting selected data.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a SDRAM memory having a memory bank 12, which is constructed as a matrix memory with memory cells. A plurality of memory banks is usually provided, but they are not explicitly illustrated. The memory cells of the memory bank 12 can be individually addressed by a first column decoder 10 via column lines and by a row decoder 9 via row lines. Furthermore, a segment decoder 8 is provided, by which a predetermined number of the memory cells of a row can be addressed. An address buffer 2 is provided for the addressing of the segments or of the individual memory cells, which address buffer 2 is connected to the row decoder 9 via a row line 22, to the segment decoder 8 via a segment line 23 and to the column decoder 10 via a column line 24. The address buffer 2 has address inputs 1, via which the addresses of the memory cells to be read can be predetermined.

The address buffer 2 is furthermore connected to a second column decoder 17 via a second column line 25. Furthermore, the address buffer 2 is connected to a channel control 7 via a channel line 26, the channel control 7 in turn is connected to a selection device 16 and the second column decoder 17 via second control lines 27.

Furthermore, a command decoder 4 having inputs 28 is provided, which is connected to a control logic unit 5. Moreover, the address buffer 2 is connected to the control logic unit 5 via a state or mode register 3.

The control logic unit 5 is connected via a third control line 29 to the address buffer 2, the row decoder 9, a sense amplifier circuit 30, the first column decoder 10 and an output memory 20. The address buffer 2 is additionally connected to the command decoder 4. Furthermore, a timer 6 is provided, which is connected to the command decoder 4, the control logic unit 5 and the output memory 20. Moreover, a computing unit 40 is provided, which is connected to the address inputs 1 and the inputs 28.

The amplifier circuit 30 is connected to the memory cells of the memory bank 12 via read and write lines and is connected to a buffer memory 15 via a first databus 14. The buffer memory 15 is constructed in the form of n memory channels 31. Each of the memory channels 31 is configured for example as a matrix-type RAM memory. The buffer memory 15 is connected to the selection device 16 via control lines 32 and to the second column decoder 17 via control lines 18 and to the output memory 20 via a second databus 19. The output memory 20 is in turn connected via a third databus 34 to an input and output memory 21, to which data lines 33 are applied.

The schematic method of operation of the configuration shown in FIG. 1 is now briefly explained. Predetermined signals are applied via the inputs 28 of the command decoder 4, which signals inform the command decoder 4 that data are intended to be output from the memory bank 12 in a predetermined manner. At the same time, the memory addresses of the data to be read out are applied to the address buffer 2 via the address inputs 1. If the command decoder 4 receives a correct command signal via the inputs 28, then the applied command is forwarded to the control logic unit 5. The control logic unit 5 and the command decoder 4 are supplied with a pre-determined clock signal by the timer 6. The control logic unit 5 drives the row decoder 9, the first column decoder 10 and the amplifier circuit 30 in accordance with the predetermined command.

From the memory addresses fed by the address buffer 2, the column decoder 10 determines the column lines, which must be activated for the purpose of reading out the selected data. Likewise, on the basis of the memory addresses fed by the address buffer 2, the row decoder 9 determines the row lines, which must be activated for the purpose of reading out the selected data. If the row decoder 9 and the column decoder 10 then receive a drive signal from the control logic unit 5, then the selected column and row lines are activated and the data of the selected memory cells are thereby transferred to the amplifier circuit 30. The amplifier circuit 30 amplifies the signals fed from the selected memory cells and forwards them via the first databus 14 to the buffer memory 15. In the buffer memory 15, the signals of the read memory cells are stored in a selected memory channel 31. The memory channel 31 is selected by the selection device 16, which is in turn driven by the address buffer 2 via the channel control 7.

The data stored in the memory channel 31 are read from the memory channel 31, which is defined by the selection device 16, through driving of the second column decoder 17 and are transferred via the second databus 19 to the output memory 20. After a corresponding control command by the control logic unit 5, the output memory 20 forwards the stored data via a third databus 34 to the input/output memory 21, to which the data lines 33 are connected. Consequently, the data are present on the data lines 33 and can be interrogated.

If the command that data of a predetermined segment are intended to be read out is then fed to the command decoder 4 via the inputs 28, then the control logic unit 5 receives the command to read out data of the predetermined segment. At the same time, the addresses of the read segment are passed to the address buffer 2 at the address inputs 1. The address buffer 2 forwards the addresses to the segment decoder 8, which in turn activates the segment to be read via control lines 36. At the same time, the control logic unit 5 passes to the row decoder 9 the signal to activate the row of the corresponding segment, and passes to the amplifier circuit 30 the signal to read out the data. The data of the selected segment are thereupon read out via the amplifier circuit 30 to a memory channel 31 defined by the selection device 16. With this type of read-out, the first column decoder 10 is not driven since the data of an entire segment are read out.

The memory channel 31 is selected by the selection device 16. For the purpose of reading the data from the memory channel 31, a read-out signal is passed to the memory channel 31 via the column decoder 17. Moreover, the control logic unit 5 passes a read-out signal to the output memory 20, which reads out the data stored in the selected memory channel 31 via the second databus 19 and outputs them via the third databus 34 to the input/output memory 21 at a later point in time.

FIG. 2 schematically shows an illustration, which explains the read-out of data of a segment of the memory bank 12 via the memory channels 31. The memory bank 12 is divided into four segments 38 per row 39. One of the four segments 38 can be selected via the segment decoder 8. At the same time, a row and thus a single segment can be selected via the row decoder 9. If a corresponding signal is then present on the memory bank 12 over the segment decoder 8 and the row decoder 9, then the memory cells of a selected segment, which are situated on a row are activated. At the same time, the amplifier circuit 30 is activated by the control logic unit 5, with the result that the data of the selected segment are written to one of the memory channels 31. The memory channel 31 is selected by the selection device 16. Afterward, the data of the segment, which are stored in the memory channel 31 are read out to the input/output memory 21 at a later point in time.

FIG. 3 shows the division of the memory bank 12 into rows 37, the individual rows being subdivided into segments 38. One row 37 is subdivided into four segments 38. In the embodiment illustrated, a row has a storage capacity of 4 kb. A segment thus has a storage capacity of 1 kb.

There are preferably sixteen memory channels 31 provided in the buffer memory 15, each memory channel 31 having a storage capacity of 1 kb.

FIGS. 4A–4C show the construction of different memory channels 31 which are configured in the form of matrix memories and differ in the number of rows 39. FIG. 4A shows a matrix memory with four rows 37, 256 bits being stored in each row 37. The rows 37 are connected to the input/output memory 21 which likewise has four memory locations which can be read in or out simultaneously via data lines 33.

The individual data of the memory channel 31 are read out in parallel via the four rows 37, the datum to be read out being defined by the specification of the corresponding column address, the column address being set by the second column decoder 17.

FIG. 4B shows the memory channel 31 in the form of a matrix memory, which has eight rows 37. 128 bits are stored in the row 37 and can be individually output via the specification of the column address. In this embodiment, eight bits are output simultaneously to the input/output memory 21, which is provided with eight data lines 33.

FIG. 4C shows a further embodiment of the memory channel 31 which has sixteen rows 37. 64 bits are stored in each of the sixteen rows 37 and can be output via a specification of the corresponding column address. In FIG. 4C, sixteen data are output in parallel from a respective row 39 to the input/output memory 21, which is provided with sixteen data lines 33.

FIG. 5 schematically shows the construction of the method according to the invention, in which the selected data which are intended to be output first via the data lines 33 are defined and either written first in the memory channel 31 and then the remaining data of the selected segment are written to the memory channel 31 or the remaining data of the selected segment are written to another memory channel 31. Since the number of selected data, which are written to the memory channel 31 is relatively low, the interference signal generated by the writing process is also relatively small.

In the upper region of FIG. 5, the symbol CLK indicates the time base, which is prescribed by the timer 6. At the timing clock signal 0, an activation command ACT is applied to the command decoder 4 via the inputs 28 and the addresses of the data to be read out are applied to the address inputs 1 of the address buffer 2. In this case, in the exemplary embodiment described, a row R0 of a memory bank A is opened by the control logic unit 5 by the row decoder 9. If a plurality of memory banks is provided, then a bank decoder is used in order to define the memory bank to be opened. At the same time, the amplifier circuit 30 of the row R0 is activated.

At the timing clock signal 2, a pre-fetch command is executed, in the case of which the address buffer 2 passes the addresses of the third segment (Seg. 3), the column addresses of the selected data (COL1) of the row R0 and the address of a fifth memory channel 31 (CH5) to the segment decoder 8, the selection device 16 and the first column decoder 10. In this exemplary embodiment, the data of the first column (COL1) are used as selected data. At the same time, the control logic unit 5 passes a signal to the amplifier circuit 30, which signal starts a read-out of the selected data of the first column (COL1) and of the row R0 of the third segment into the fifth memory channel 31. In this case, a first column of the fifth memory channel 31, to which the selected data are written, is selected by the selection device 16. In this way, the selected data are written to the fifth memory channel 31.

At the timing clock signal 3, a pre-fetch command is effected internally, i.e. without external control, in the case of which command the column addresses of the row 0 of the third segment which do not belong to the selected data, the so-called remaining data (COL 2–COL 256), in a x4 module of the row R0 are applied to the first column decoder 10. In this exemplary embodiment, the data of the 2nd to 256th column of the row R0 are addressed. The remaining data are subsequently transferred into corresponding columns of the fifth memory channel 31. The pre-fetch command at the timing clock signal 3 is caused by the pre-fetch command at the timing clock signal 2.

At the timing clock signal 4, by a read command in the case of which corresponding addressing of the fifth memory channel 31 (CH 5) and addressing of the output memory 20 are effected, the selected data of the first column (COL1) can be read from the fifth memory channel 31 and output via the input/output memory 21 to the data lines 33.

At a later timing clock signal, by a read command in the case of which corresponding addressing of the 2nd to 256th column of the fifth memory channel 31 and addressing of the output memory 20 are effected, the remaining data of the 2nd to 256th column of the fifth memory channel can be read out and output via the input/output memory 21 to the data lines 33.

Preferably, the number of data determined as selected data is the same as the number of data lines 33 of the input/output memory 21. In other words, in the case of sixteen data lines 33, sixteen data are also selected as selected data and read-out first into a memory channel 31 and/or into a separate 1 memory channel 31.

The use of the method according to the invention makes it possible for data to be individually selected before the read-out from the amplifier circuit 30 into the buffer memory 15 and to be read first into the buffer memory 15 before other data. As a result, a smaller interference signal is generated, so that the data can be read out again more rapidly from the buffer memory 15 since the signal levels more rapidly settle to a reliable level in the buffer memory 15.

By way of example, in comparison with known burst read-out methods in which the data are read out column by column beginning with a start column, it is possible to select the data of a selected column via the selection of the column and to read out the data first independently of the position of the column within the burst operation into the buffer memory.

By way of example, the data of a column that, within a normal burst read-out operation, is situated in the middle of the order of the columns to be read will be read out first. Normal burst read-out operation is then carried out, starting with the read-out of the data of the start column. In this case, the data of the column already read are then preferably not read out again.

I claim:

1. A method for storing and outputting data, which comprises the steps of:

storing the data in a semiconductor memory having memory cells for storing the data;

loading a predetermined quantity of the data from the semiconductor memory into a buffer memory using an amplifying circuit by the steps of:

determining a predetermined number of selected data of the predetermined quantity which is intended to be output first; and loading the selected data into the buffer memory temporally before loading remaining data of the predetermined quantity;

outputting the selected data from the buffer memory through an output unit; and outputting the remaining data from the buffer memory through the output unit.

2. A method for storing and outputting data, which comprises the steps of:

storing the data in a memory;

loading a predetermined quantity of the data from the memory into a buffer memory by the steps of:

determining a predetermined number n of selected data of the predetermined quantity which is intended to be output first; and loading the selected data into the buffer memory temporally before loading remaining data of the predetermined quantity;

outputting the selected data from the buffer memory through an output unit using a parallel interface with n lines; and outputting the remaining data from the buffer memory through the output unit.

3. The method according to claim 1, which comprises writing in the remaining data to the buffer memory temporally later than the predetermined number of the selected data.

4. A device for storing and reading out data, comprising:

a semiconductor memory having memory cells;

a buffer memory connected to said semiconductor memory;

an output unit connected to said buffer memory;

a control unit for defining a total quantity of the data intended to be read out and connected to said semiconductor memory, said buffer memory and said output unit, said control unit determining a predetermined number of selected data which are intended to be read out first from the total quantity of the data, said control unit first loading the selected data into said buffer memory and subsequently outputting the selected data using said output unit; and an amplifier circuit connected to said memory cells and said buffer memory.

5. The device according to claim 4, wherein said control unit loads remaining data of the total quantity of the data into said buffer memory before the outputting of the selected data from said buffer memory and outputs the remaining data after the outputting of the selected data from said buffer memory.

6. The device according to claim 4, including a column decoder and a row decoder each connected to said memory cells and said control unit, said control unit addresses individually said memory cells by driving said column decoder and said row decoder and transfers the data of said memory cells through said amplifier circuit to said buffer memory.

7. The device according to claim 4, wherein said memory buffer has memory rows, said output unit is an interface with n parallel data lines connected to said memory rows of said buffer memory, and said memory rows can be read out simultaneously from said buffer memory.

* * * * *